(12) United States Patent
Honmura

(10) Patent No.: US 6,845,496 B2
(45) Date of Patent: Jan. 18, 2005

(54) SEMICONDUCTOR INTEGRATED CIRCUIT DEVICE USING PROGRAMMABLE PERIPHERAL CONTROL

(75) Inventor: Tetsuroo Honmura, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 31 days.

(21) Appl. No.: 10/173,661

(22) Filed: Jun. 19, 2002

(65) Prior Publication Data

US 2003/0042554 A1 Mar. 6, 2003

(30) Foreign Application Priority Data

Aug. 30, 2001 (JP) ........................................ 2001-260592

(51) Int. Cl.⁷ .............................................. G06F 17/50
(52) U.S. Cl. ........................... 716/14; 257/690; 716/10; 716/12; 716/17
(58) Field of Search ............................ 257/690; 716/10, 716/12, 14, 17, 1, 4, 5; 703/17, 20; 713/200

(56) References Cited

U.S. PATENT DOCUMENTS

| 5,434,562 A | * | 7/1995 | Reardon ...................... 713/200 |
| 5,784,291 A | * | 7/1998 | Chen et al. .................... 716/10 |
| 6,580,164 B1 | * | 6/2003 | Ohie .......................... 257/690 |
| 2002/0059054 A1 | * | 5/2002 | Bade et al. ................... 703/20 |
| 2002/0152060 A1 | * | 10/2002 | Tseng .......................... 703/17 |

FOREIGN PATENT DOCUMENTS

JP          11-289051          10/1999

* cited by examiner

Primary Examiner—Thuan Do
(74) Attorney, Agent, or Firm—Miles & Stockbridge P.C.

(57) ABSTRACT

A programmable peripheral LSI contains a number of microprocessor peripheral IPs. A switch is provided for selectively disabling peripheral IPs. As a result, the peripheral IPs are disabled while they are not used. An improved system design method uses an evaluation board provided with the programmable peripheral LSI.

10 Claims, 7 Drawing Sheets

SEMICONDUCTOR INTEGRATED CIRCUIT DEVICE USING PROGRAMMABLE PERIPHERAL CONTROL

FIELD OF THE INVENTION

The present invention relates to an embedded microprocessor and its peripheral LSI that are incorporated in cellular phones, cameras, and other system devices. More particularly, the present invention relates to a hardware-programmable peripheral LSI carrying peripheral IPs for the interfaces of various peripheral devices, a one-chip microprocessor incorporating said LSI and CPU core, and a device for evaluating and verifying embedded systems with said LSI and microprocessor mounted on board.

BACKGROUND OF THE INVENTION

A wide variety of interface protocols are used for data exchange among computers, peripheral devices such as hard disk drives and scanners, and cellular phone, digital camera, and video systems. A one-chip microprocessor, which is integrated with a CPU core and peripheral IPs conforming to various interface protocols, is developed to support a wide variety of interfaces. The term "peripheral IPs" used in the present application refers to circuit modules that provide an interface for connecting the CPU core to external devices.

Within this type of microprocessor, all of its peripheral IPs are not used at all times. Since some peripheral IPs are not used, it is necessary to exercise control so as to enable/disable the peripheral IPs.

One control method is to provide each peripheral IP with a control register so that the CPU core enters a command for each control register via a peripheral bus to specify whether the associated peripheral IP should be enabled or disabled (first conventional technology).

The method stated in JP-A No. 289051/1999 is to use a programmable circuit, which is typically represented by an FPGA. A programmable circuit is integrated with an MPU and various interface circuits. This programmable circuit is used after LSI manufacture to determine the wiring connections between the MPU and various interface circuits. As a result, various interface sets can be supported by a single LSI (second conventional technology).

As the number of interfaces to be supported by the CPU core, the number of peripheral IPs increases, causing the following problems:

When the first conventional technology is used, the increase in the number of peripheral IPs may increase the number of output pins, thereby raising the package price. Further, even when some peripheral IP circuits are disabled by a command, they still run in a sleep mode, allowing unnecessary power consumption to continue. The term "sleep mode" refers to a mode of operation in which the command transmission from the CPU or a device outside the LSI is monitored. If there are many unnecessary peripheral IPs, the software designer may also be perplexed.

When the second conventional technology is used, the MPU and interface circuits are directly connected by the programmable circuit. Therefore, the resulting configuration differs from the microprocessor's common configuration, which is established via a bus. That is why the configuration based on the second conventional technology is inapplicable to general-purpose processors. Further, the second conventional technology has not disclosed a configuration that would reduce the amount of unnecessary power consumption.

In a volume production of an LSI, it is possible to develop an LSI that carries only necessary peripheral IPs. In limited production of diversified products, however, the development cost of such an LSI would prove to be excessive. If a single kind of LSI could be commonly used for limited production of diversified products, it would be possible to reduce the development cost and shorten the development period.

SUMMARY OF THE INVENTION

A first object of the present invention is to provide a semiconductor integrated circuit device suitable for a general-purpose LSI that can be adopted for the limited production of diversified products.

A second object of the present invention is to provide a method of efficiently developing a system or an LSI for use with a system, using an evaluation chip carrying peripheral IPs.

To solve the above problems, a peripheral IP selection switch is furnished as a hardware-programmable means of disabling the peripheral bus connections for unnecessary peripheral IPs in compliance with a user request. The switch is used for excluding the influence of peripheral IP operations upon the other circuits and for disabling unnecessary IPs.

The programmable peripheral LSI to be connected to the CPU core or the microprocessor integrated with the programmable peripheral LSI and CPU core can be provided, with the switch mounted, as a volume-production LSI. In addition, a board carrying the CPU core, programmable peripheral LSI, and program storage non-volatile semiconductor memory can be provided as an evaluation board.

Furthermore, the power consumption can be reduced by shutting off the power supply to the peripheral IPs to be disabled.

Other and further objects, features and advantages of the invention will appear more fully from the following description.

DETAILED DESCRIPTION OF THE PREFERRED EMBODIMENTS

The embodiments of the present invention are detailed below with reference to drawings.

First Exemplary Embodiment

Figure 1:
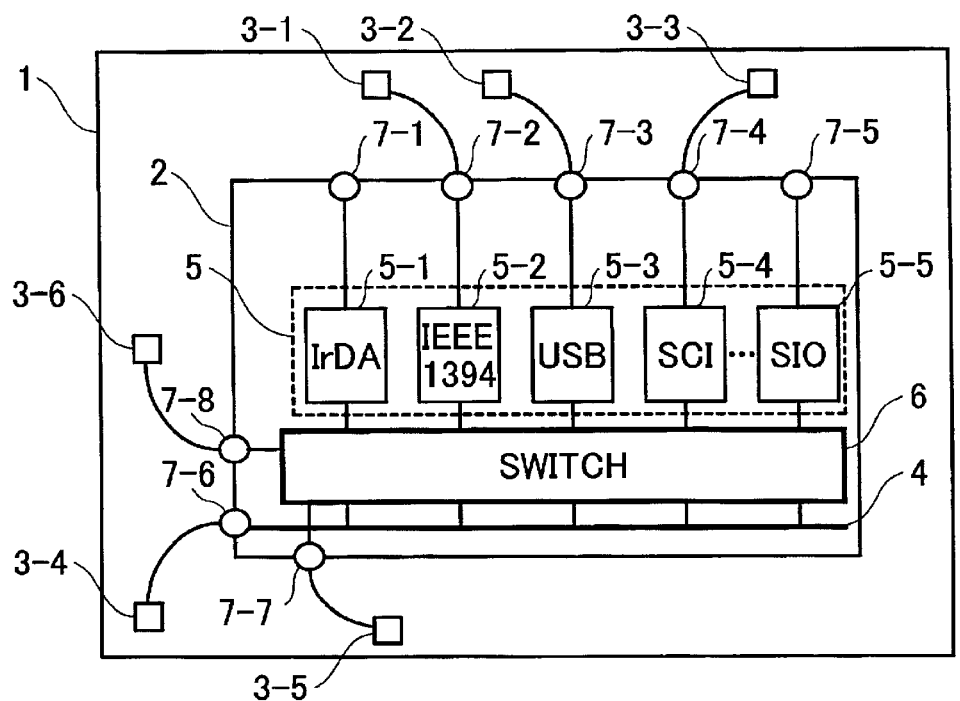
FIG. 1 shows the structure of the programmable peripheral LSI for a first exemplary embodiment of the present invention.

FIG. 1 is a block diagram of a programmable peripheral LSI that incorporates peripheral IPs for supporting various interface protocols and a switch for selecting such peripheral IPs.

An LSI chip 2 is molded by an LSI package 1. The LSI package 1 has pads 3 for external connection. The pads 3 are connected to terminals 7 on the LSI chip 2. The LSI chip 2 has peripheral IPs 5, which are connected to a peripheral bus 4 via a switch 6.

For example, a peripheral IP 5-1 is an IrDA interface circuit for IrDA wireless communication. Peripheral IPs 5-2 to 5—5 are interface circuits for IEEE1394, USB, SCI, and SIO, respectively, all of which provide wired communication. Although FIG. 1 shows one peripheral IP for each kind of peripheral IP, two or more peripheral IPs of one kind can be incorporated.

The switch 6 has a program input terminal 7—7. The input terminal 7—7 is connected to a pad 3-5. The program for specifying the effective peripheral IPs is to be entered via the pad 3-5.

The peripheral bus 4 is connected to a bus terminal 7-6. The bus terminal 7-6 is connected to a pad 3-4. Data is exchanged with a peripheral bus (not shown in the figure) external to the LSI via the pad 3-4. Being connected to a pad 3-6, a power supply terminal 7-8 receives a power supply potential from the outside of the LSI via the pad 3-6.

In the example shown in FIG. 1, peripheral IPs 5-2 to 5-4 are enabled whereas peripheral IPs 5-1 and 5—5 are disabled. In this example, the peripheral IPs to be disabled are not connected to any pad. The use of this configuration makes it possible to use a package having a decreased number of pads and reduce the cost of the package.

Figure 2:
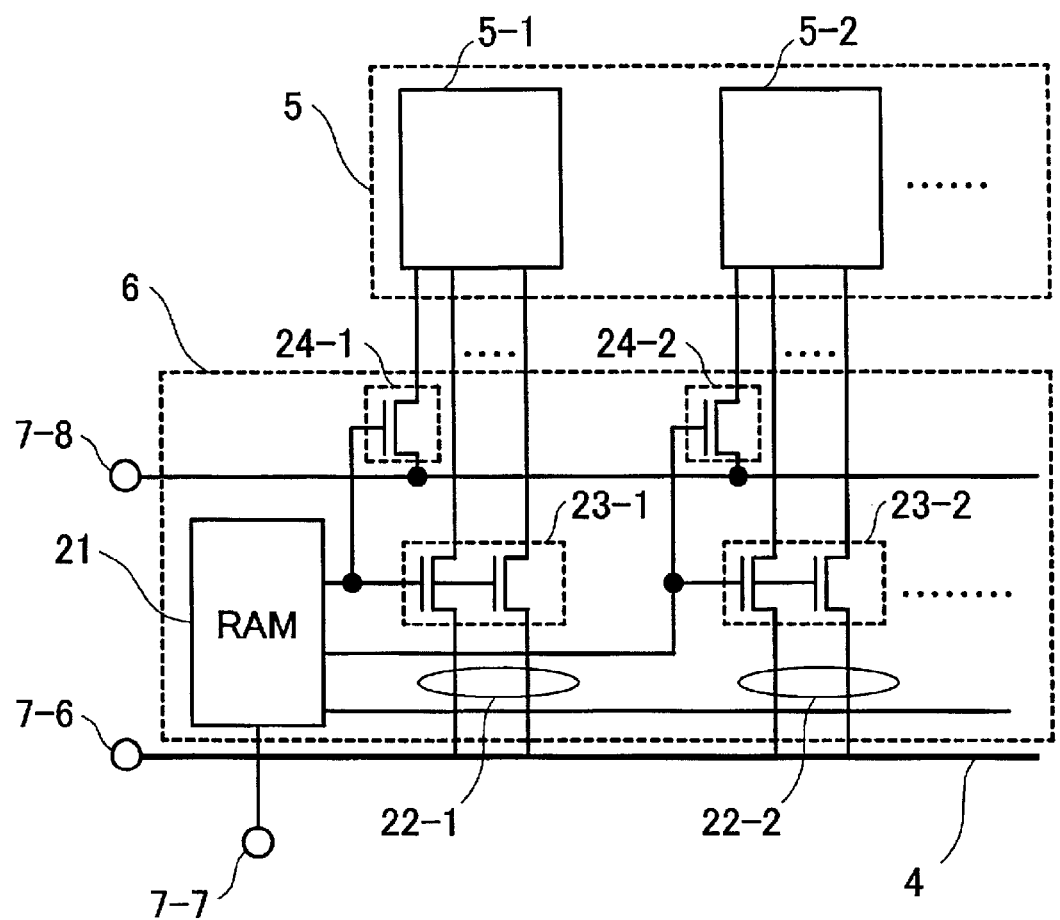
FIG. 2 shows the structure of the switch.

FIG. 2 is used to explain about the method of enabling and disabling the peripheral IPs of the present invention. The switch 6 has switching elements 23 and 24. The switching element 23 is provided for the line connecting a RAM 21, peripheral IP 5, and peripheral bus 4. The switching element 24 is provided for the line connecting the power supply terminal 7-8 and peripheral IP 5.

For example, the switching element 23, which is a component of the switch 6, can be implemented by a MOS transistor (the present invention uses the term "MOS transistor" for representing an insulated gate type field effect transistor) having a source-drain path in the connection path between a peripheral IP and peripheral bus 4. Switching elements composing a switch 23-1 for peripheral IP 5-1 are controlled by a common, first control signal. Switching elements composing a switch 23-2 for peripheral IP 5-2 are controlled by a common, second control signal.

Similarly, the switching elements composing a switch 24 can also be implemented by a MOS transistor. Switch 24-1 for peripheral IP 5-1 is controlled by said first control signal. Switch 24-2 for peripheral IP 5-2 is controlled by the second control signal.

When a switching element is turned ON by a control signal, the function of data transfer between a peripheral IP and peripheral bus is enabled with a power supply potential supplied. Therefore, the peripheral IP is enabled. On the other hand, when a switching element is turned OFF by a control signal, the function of data transfer between a peripheral IP and peripheral bus is disabled with no power supply potential supplied. Therefore, the peripheral IP is disabled. The RAM 21 stores these control signals in such a manner that value of a stored control signal for turning ON a switching element is 1, and that the value of a stored control signal for turning OFF a switching element is 0.

Figure 3:
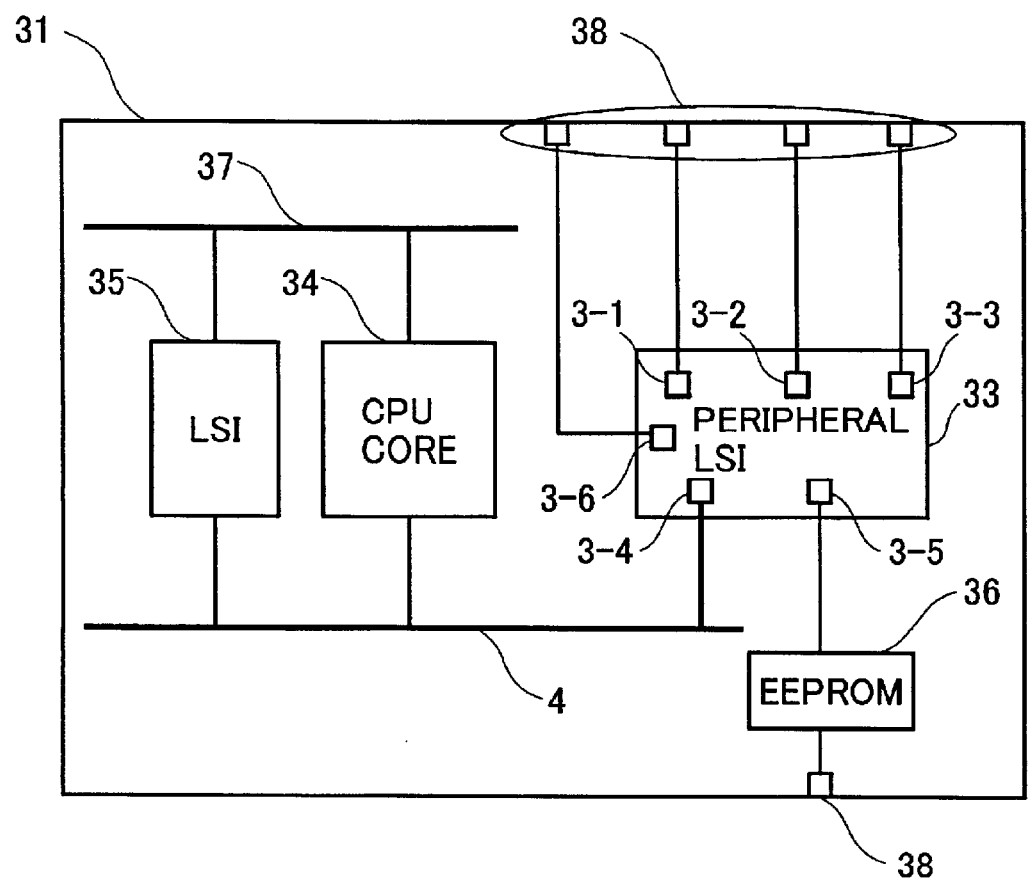
FIG. 3 is a block diagram of a chip set that uses the programmable peripheral LSI of the present invention.

FIG. 3 shows a typical chip set that carries a programmable peripheral LSI of the present invention. LSIs are mounted on a board 31 and interconnected by a peripheral bus 4 and memory bus 37. An external signal or power supply potential is supplied to these LSIs via adaptors 38 and signal lines.

A programmable peripheral LSI 33 corresponds to the LSI shown in FIG. 1. It is connected to a CPU core LSI 34 via the on-board peripheral bus 4. As indicated in the figure, the programmable peripheral LSI 33 of the present invention employs a bus and therefore complies with the general chip set configuration requirements.

Further, a non-volatile semiconductor memory 36 is mounted on the board. This memory stores control data that is to be written into the RAM 21 (see FIG. 2).

When the board is configured in the above-mentioned manner, a desired CPU core can be used at the time of system configuration to select a desired peripheral IP from those incorporated in the peripheral LSI 33 for use. Consequently, the flexibility of system design can be increased. Although FIG. 3 indicates that the chips are mounted on the board, they can be mounted in a single package to form a multi-chip package (MCP).

For ease of understanding, FIG. 3 discloses major data signal lines only. Of course, other data signal lines, control signal lines, power supply lines, and other lines also exist. The same holds true for the other drawings as well.

Figure 4:
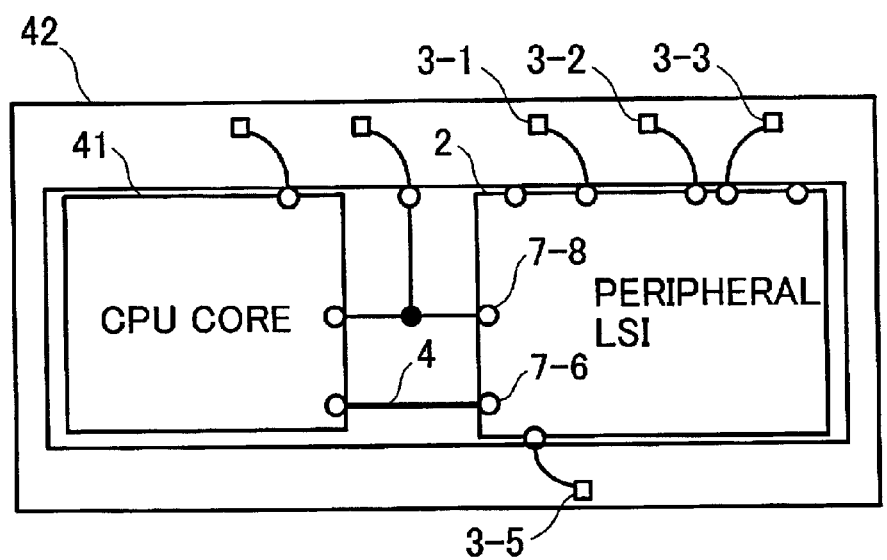
FIG. 4 is a block diagram of a microprocessor that is obtained by integrating the programmable peripheral LSI and CPU core into a single chip.

FIG. 4 shows a modified version of the example shown in FIG. 1. The example shown in FIG. 4 is a microprocessor 42, which is composed by integrating a peripheral LSI chip 2 and CPU core 41 into a single chip. The advantage to this embodiment is that it can increase the degree of integration by integrating a CPU and peripheral IPs into a single chip.

Second Exemplary Embodiment

In the second exemplary embodiment, the LSI shown in FIG. 1 is used for system verification.

Figure 5:
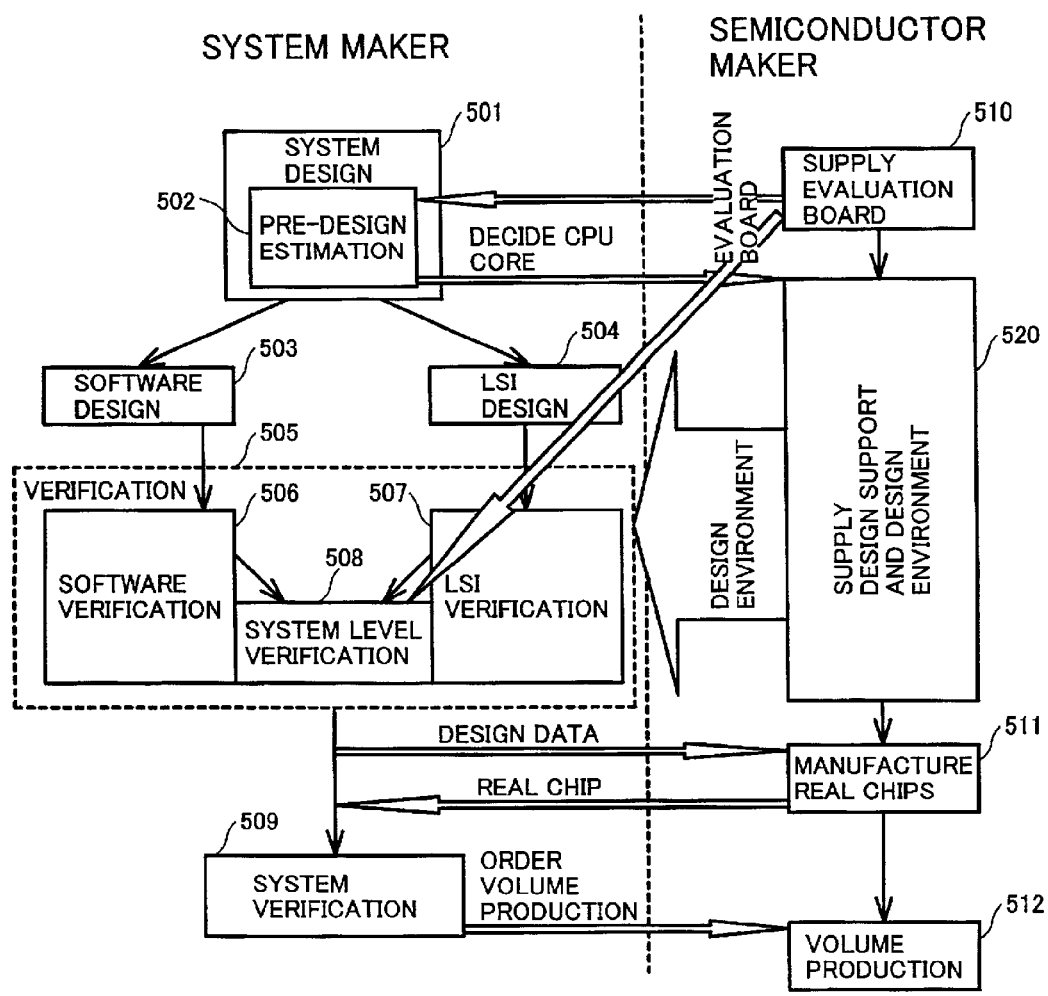
FIG. 5 is a system/LSI design flowchart of a second exemplary embodiment of the present invention.

FIG. 5 shows a system/LSI design flowchart. The term "system" refers to mobile information devices such as a cellular phone and PDA having various LSIs, liquid-crystal panel, and other components mounted on a board. The left-hand half of FIG. 5 shows the flowchart for a system maker. The right-hand half of FIG. 5 shows the flowchart for a semiconductor maker.

The system maker performs system design (step 501). This step is performed to design the entire system and determine the portions to be implemented by software and the portions to be implemented by hardware. The portions to be implemented by hardware are assembled into a so-called ASIC (Application Specific Integration Circuit). At this time, a semiconductor maker provides (step 510) in compliance with a system maker's request an evaluation board carrying a CPU core 34 and peripheral LSI 33, which are described later with reference to FIG. 6. The system maker uses the evaluation board to conduct pre-design estimation (step 502) and decide on the CPU core to be used for an ASIC.

In pre-design estimation 502, the evaluation board is used to check whether the specifications are met by the performance of software executed by the CPU core 34 and the capability of data transfer to a peripheral device via the CPU core and peripheral LSI 33. In this sense, the pre-design estimation exerts a great influence upon the decision on the CPU core and the semiconductor maker who supplies the CPU core.

When the CPU core is decided on, the system maker complies with the system design criteria to perform software design (step 503) and LSI design (step 504), which provides ASIC design, and verifies such designs (step 505). The semiconductor maker offers design support and design environment to the system maker (step 520).

Step 505 includes step 506 for software verification, step 507 for ASIC verification, and step 508 for system level verification with an evaluation board supplied by the semiconductor maker. System level verification 508 is performed simultaneously with software verification 506 and LSI verification 507 when the latter two verification steps are performed to a certain extent. The reason is that a higher degree of verification efficiency can be achieved than by conducting system level verification after completion of software/LSI verification.

When verification is completed in step 505, the system maker delivers design data to the semiconductor maker. LSI layout data and logic gate level data are both acceptable as the design data. The choice between these two types of data is made in accordance with the system maker's LSI design capability and agreement with the semiconductor maker. The semiconductor maker creates a real chip in compliance with the design data supplied by the system maker (step 511). The system maker performs system verification 509 with the supplied real chip. Upon completion of system verification, the system maker instructs the semiconductor maker to start a volume production of the chip.

The semiconductor maker does not have to complete all steps 510–511 by itself. The semiconductor maker may work together with its affiliated companies to perform these tasks.

Figure 6:
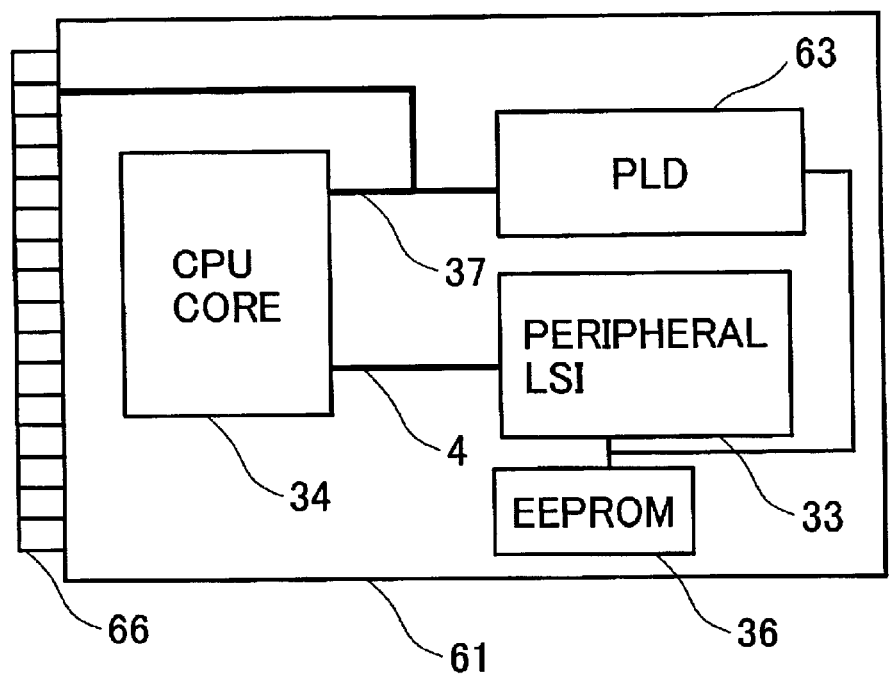
FIG. 6 is a block diagram of an evaluation board that uses the programmable peripheral LSI of the present invention.

FIG. 6 shows the structure of the evaluation board. The evaluation board 61 carries the peripheral LSI 33, PLD 63 (FPGA or other programmable circuit), CPU core 34, and non-volatile semiconductor memory 36. All of these components are sealed packages of semiconductor chips. The peripheral LSI 33 is structured as shown in FIG. 1 and FIG. 2. The CPU core 34 is connected to the peripheral LSI 33 via the peripheral bus 4. Further, the CPU core 34, PLD 63, and system evaluation board interface 66 are interconnected via a memory bus 37. The user's logic supplied by the system maker is programmed in the PLD 63. The non-volatile semiconductor memory 36 stores the control data (stored in the RAM 21 shown in FIG. 2) for selecting a peripheral IP of the peripheral LSI 33 and the user's logic to be programmed in the PLD 63, and is electrically reprogrammable.

When the evaluation board is used, a desired peripheral IP of the peripheral LSI is selected, and the user's logic is programmed in the PLD 61 to conduct evaluation and verification. Eventually, an ASIC is created by integrating into a single chip the CPU core 34, the user-selected peripheral IP of peripheral LSI 33, and the user's logic programmed in the PLD 63.

Figure 7:
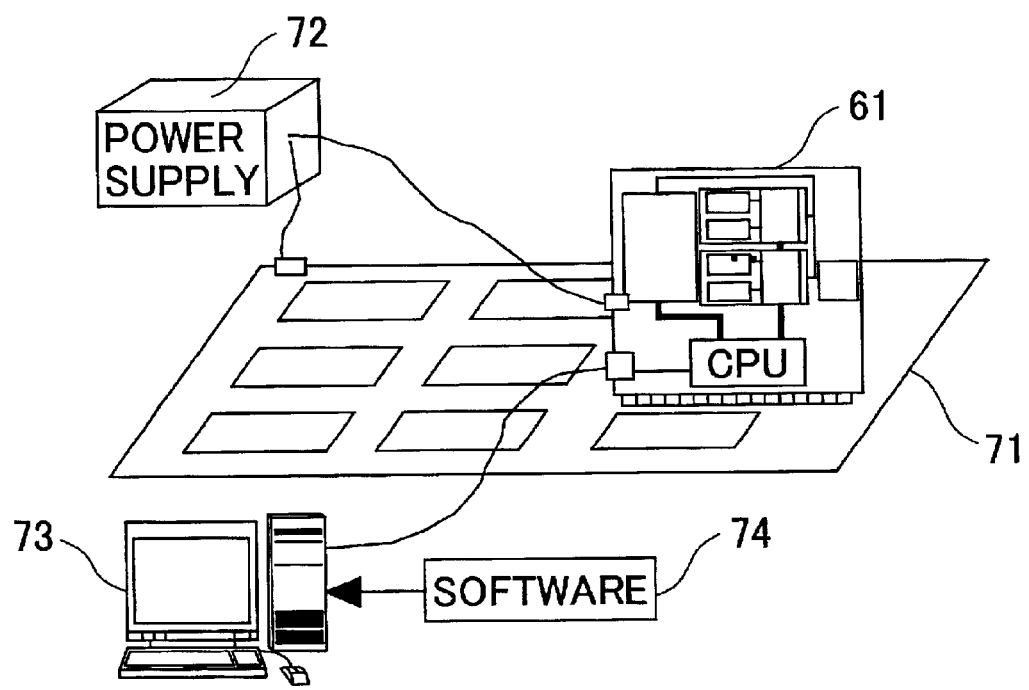
FIG. 7 shows how the evaluation board and system evaluation board of the present invention are used for evaluation/verification.

FIG. 7 shows how the evaluation board is used. The evaluation board 61 is mounted on the user's system evaluation board 71. A power supply 72 supplies power to the evaluation board 61 and system evaluation board 71. Further, system level evaluation and verification are conducted by operating software 74 with the evaluation board 61 connected to a PC 73 on which an emulator/debugger runs. In some conventional evaluation/verification equipment containing a number of peripheral IPs, each peripheral IP is implemented by an LSI. In such an instance, however, the overall evaluation/verification equipment is housed within a casing and cannot be mounted on the system evaluation board 71. Even when the programmable peripheral LSI 33 contains a number of unnecessary peripheral IPs, the present invention makes it possible to offer a compact board without having to develop dedicated evaluation/verification equipment.

On the basis of a peripheral LSI containing a number of peripheral IPs, it is possible to offer at a minimum development cost a peripheral LSI that is equal in the number of pins and power consumption to an LSI incorporating only peripheral IPs necessary for the user.

Further, when said LSI is used as ASIC evaluation/verification equipment, it is possible to cut the development cost for such equipment.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A semiconductor integrated circuit device which comprises:
   a plurality of external pads;
   a first circuit module complying with a first interface protocol, said first circuit module being connected to one of the plurality of external pads,
   a second circuit module complying with a second interface protocol, said second circuit module not being connected to any of the plurality of external pads,
   a peripheral bus,
   a first switching element for connecting said first circuit module to said peripheral bus, and
   a second switching element for connecting said second circuit module to said peripheral bus,
   wherein said first switching element turns ON to enable said first circuit module and said second switching element turns OFF to disable said second circuit module.

2. A semiconductor integrated circuit device according to claim 1, further comprising a CPU core.

3. A method of designing a system, which comprises the steps of:
   determining a first section of said system to be implemented by software and a second section of said system to be implemented by hardware,
   designing software for said first section,
   designing an integrated circuit for said second section,
   verifying said designed software,
   verifying said designed integrated circuit, and
   verifying said system using an evaluation board, said evaluation board including:
      a CPU core,
      a peripheral LSI having a plurality of circuit modules, each circuit module related to a different interface protocol, wherein at least one of said circuit modules is selectively used in said peripheral LSI, and
      a programmable circuit to program a user's logic for said designed integrated circuit,
      wherein each of said CPU core, said peripheral LSI and said programmable circuit is implemented in a different package.

4. The method of designing a system according to claim 3, wherein the step of verifying said system is performed simultaneously with the steps of verifying said software and said integrated circuit.

5. An evaluation board which comprises:
   a CPU core,
   a peripheral LSI including a plurality of circuit modules, each circuit module related to a different interface protocol, wherein at least one of said circuit modules is selectively used in said peripheral LSI,
   a programmable circuit to program a user's logic,
   a memory bus for connecting said CPU core to said programmable circuit, and
   a peripheral bus for connecting said CPU core to said peripheral LSI, wherein each of said CPU core, said peripheral LSI and said programmable circuit is implemented in a different package.

6. The evaluation board according to claim 5, further comprising a non-volatile semiconductor memory for storing a control signal, wherein said control signal enables/disables the circuit modules of said peripheral LSI.

7. A semiconductor integrated circuit device, comprising:
   a plurality of external pads;
   a peripheral bus;
   a power supply for supplying a power supply potential;
   a first circuit module complying with a first interface protocol, said first circuit module being connected to one of the plurality of external pads,
   a second circuit module complying with a second interface protocol, said second circuit module not being connected to any of the plurality of external pads,
   a first switching element to connect said first circuit module to said peripheral bus, wherein said first switching element turns ON to enable said first circuit module;
   a second switching element to connect said second circuit module to said peripheral bus, wherein said second switching element turns OFF to disable said second circuit module;
   a third switching element to connect said first circuit module to said power supply potential point, wherein said third switching element turns ON to enable said first circuit module; and
   a fourth switching element to connect said second circuit module to said power supply potential point, wherein said fourth switching element turns OFF to disable said second circuit module.

8. The semiconductor integrated circuit device according to claim 7, wherein a first control signal controls the status of said first switching element and said third switching element, and a second control signal controls the status of said second switching element and said fourth switching element.

9. The semiconductor integrated circuit device according to claim 8, further comprising a memory for storing a first control signal value and a second control signal value as programmed data.

10. The semiconductor integrated circuit device according to claim 9, wherein said programmed data is entered from the outside of said semiconductor integrated circuit device.

* * * * *